(12) United States Patent
Oh

(10) Patent No.: US 11,037,850 B2
(45) Date of Patent: Jun. 15, 2021

(54) PASSIVATION STRUCTURE AND METHODS OF MANUFACTURING A SEMICONDUCTOR DEVICE INCLUDING THE SAME

(71) Applicant: Samsung Electronics Co., Ltd., Suwon-si (KR)

(72) Inventor: Joo-Young Oh, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 53 days.

(21) Appl. No.: 16/402,654

(22) Filed: May 3, 2019

(65) Prior Publication Data

US 2020/0152539 A1    May 14, 2020

(30) Foreign Application Priority Data

Nov. 13, 2018 (KR) .................. 10-2018-0138820

(51) Int. Cl.
*H01L 23/31* (2006.01)
*H01L 23/544* (2006.01)
*H01L 21/56* (2006.01)
*H01L 23/29* (2006.01)

(52) U.S. Cl.
CPC ........ *H01L 23/3192* (2013.01); *H01L 21/561* (2013.01); *H01L 23/293* (2013.01); *H01L 23/3171* (2013.01); *H01L 23/544* (2013.01); *H01L 2223/5446* (2013.01)

(58) Field of Classification Search
CPC combination set(s) only.
See application file for complete search history.

(56) References Cited

U.S. PATENT DOCUMENTS

| 8,120,176 | B2 | 2/2012 | Shin et al. | |
|---|---|---|---|---|
| 2006/0109014 | A1* | 5/2006 | Chao | G01R 31/2884 324/756.03 |
| 2007/0181971 | A1* | 8/2007 | Park | H01L 28/10 257/531 |
| 2010/0025824 | A1* | 2/2010 | Chen | H01L 23/49811 257/620 |
| 2010/0123219 | A1* | 5/2010 | Chen | B23K 26/364 257/620 |
| 2013/0241049 | A1* | 9/2013 | Yu | H01L 22/32 257/737 |
| 2014/0232001 | A1* | 8/2014 | Gratz | H01L 23/562 257/762 |

(Continued)

FOREIGN PATENT DOCUMENTS

| JP | 08-339976 | 12/1996 |
|---|---|---|
| JP | 1996-339976 A | 12/1996 |
| JP | 2006-108489 A | 4/2006 |

(Continued)

*Primary Examiner* — Nduka E Ojeh
(74) *Attorney, Agent, or Firm* — Muir Patent Law, PLLC

(57) ABSTRACT

A passivation structure may include a first passivation pattern on an upper surface of a semiconductor chip provided on a semiconductor substrate, and a second passivation pattern arranged on a scribe lane of the semiconductor substrate adjacent to the semiconductor chip. The second passivation pattern is spaced apart from the first passivation pattern to form a crack-blocking groove between the second passivation pattern and the first passivation pattern.

20 Claims, 10 Drawing Sheets

(56) References Cited

U.S. PATENT DOCUMENTS

2017/0074922 A1* 3/2017 Lai .................... H01L 22/32

FOREIGN PATENT DOCUMENTS

| JP | 3872031 B2 | 1/2007 |
| JP | 2012-156258 A | 8/2012 |
| KR | 10-2005-0028085 A | 3/2005 |
| KR | 10-2013-0083149 A | 7/2013 |
| KR | 10-1534682 | 7/2015 |

* cited by examiner

PASSIVATION STRUCTURE AND METHODS OF MANUFACTURING A SEMICONDUCTOR DEVICE INCLUDING THE SAME

CROSS-RELATED APPLICATION

This application claims priority under 35 U.S.C. § 119 to Korean Patent Application No. 2018-0138820, filed on Nov. 13, 2018, in the Korean Intellectual Property Office (KIPO), the contents of which are herein incorporated by reference in their entirety.

BACKGROUND

1. Field

Example embodiments relate to a passivation structure and methods of manufacturing a semiconductor device including the same. More particularly, example embodiments relate to a passivation structure for protecting semiconductor chips on a semiconductor substrate, and methods of manufacturing a semiconductor device including the passivation structure.

2. Description of the Related Art

Generally, a passivation layer may protect a plurality of semiconductor chips on a semiconductor substrate. In order to form semiconductor packages from the semiconductor chips, the semiconductor substrate may be sawed along scribe lanes.

The cutting process may use a blade or a laser. The cutting process using the blade may include sawing the passivation layer on the scribe lane and the scribe lane using the blade. The cutting process using the laser may include attaching a die attach film to the passivation layer, irradiating the laser to the passivation layer and the scribe lane to form a cut line, drawing the die attach film along the cut line to separate the semiconductor chips, and partially removing a lower surface of the semiconductor substrate using a grinder.

According to related arts, when the semiconductor substrate is sawed using the blade, a crack generated in the passivation layer by the blade may spread to the semiconductor chips through the passivation layer on the semiconductor chips because a portion of the passivation layer on the scribe lane and a portion of the passivation layer on the semiconductor chips may be connected with each other. The crack may damage the semiconductor chips. Thus, when the cutting process using the blade may be applied to the semiconductor substrate, the passivation layer may not be formed on the scribe lane to prevent the spreading of the crack.

When the semiconductor substrate may be sawed using the laser under a condition that the passivation layer is be formed on the scribe lane, although the semiconductor chips may be connected with each other via the die attach film, the semiconductor chips may be positioned adjacent to each other. Thus, the semiconductor chips may collide with each other in the grinding process and the semiconductor chips may be damaged. Therefore, when the cutting process using the laser may be applied to the semiconductor substrate, the passivation layer may be formed on the scribe lane to prevent the damage of the semiconductor chips.

As a result, only one of the cutting process using the blade and the sawing process using the laser may be applied to the semiconductor substrate in accordance with structures of the passivation layer.

SUMMARY

Example embodiments provide a passivation structure to which cutting processes using a blade and a laser may be applied.

Example embodiments also provide methods of manufacturing a semiconductor device including the above-mentioned passivation structure.

According to some embodiments, the disclosure is directed to a passivation structure comprising: a first passivation pattern on an upper surface of a semiconductor chip provided on a semiconductor substrate, and a second passivation pattern arranged on a scribe lane of the semiconductor substrate adjacent to the semiconductor chip. The second passivation pattern is spaced apart from the first passivation pattern to form a crack-blocking groove between the second passivation pattern and the first passivation pattern.

According to some embodiments, the disclosure is directed to a passivation structure comprising: a plurality of first passivation patterns, each of the first passivation patterns arranged on an upper surface of a respective one of a plurality of semiconductor chips provided on a semiconductor substrate; and a second passivation pattern arranged on scribe lanes of the semiconductor substrate for partitioning the semiconductor chips, wherein the second passivation pattern may be spaced apart from each first passivation pattern to form a crack-blocking groove between the second passivation pattern and each of the first passivation patterns.

According to some embodiments, the disclosure is directed to a method of manufacturing a semiconductor device, comprising: providing a semiconductor substrate having scribe lanes; forming a plurality of semiconductor chips on an upper surface of the semiconductor substrate; forming a plurality of first passivation patterns, each of the first passivation patterns arranged on an upper surface of a respective one of the plurality of semiconductor chips; and forming a second passivation pattern arranged on an upper surface of the scribe lanes, wherein the second passivation pattern may be spaced apart from each first passivation pattern to form a crack-blocking groove between the second passivation pattern and the first passivation patterns.

According to some embodiments, the disclosure is directed to a method of manufacturing a semiconductor device, the method comprising: forming a plurality of first passivation patterns, each of the first passivation patterns arranged on an upper surface of a respective one of a plurality of semiconductor chips provided on a semiconductor substrate; forming a second passivation pattern on scribe lanes of the semiconductor substrate for partitioning the semiconductor chips, the second passivation pattern spaced apart from each first passivation pattern; and cutting the semiconductor substrate along the scribe lanes to provide diced semiconductor chips.

BRIEF DESCRIPTION OF THE DRAWINGS

Example embodiments will be more clearly understood from the following detailed description taken in conjunction with the accompanying drawings.

FIG. 1 is a plan view illustrating a semiconductor device in accordance with example embodiments;

FIG. 2 is a cross-sectional view taken along a line II-II' in FIG. 1;

FIG. 3 is a plan view illustrating a semiconductor device in accordance with example embodiments;

FIG. 4 is a cross-sectional view taken along a line IV-IV' in FIG. 3;

FIG. 5 is a plan view illustrating a semiconductor device in accordance with example embodiments;

FIG. 6 is a cross-sectional view taken along a line VI-VI' in FIG. 5;

FIGS. 7 to 9 are cross-sectional views illustrating a method of cutting a semiconductor substrate using a blade in accordance with example embodiments; and FIGS. 10 to 15 are cross-sectional views illustrating a method of cutting a semiconductor substrate using a laser in accordance with example embodiments.

DETAILED DESCRIPTION

Hereinafter, example embodiments will be explained in detail with reference to the accompanying drawings.

Semiconductor Device

Figure 1:
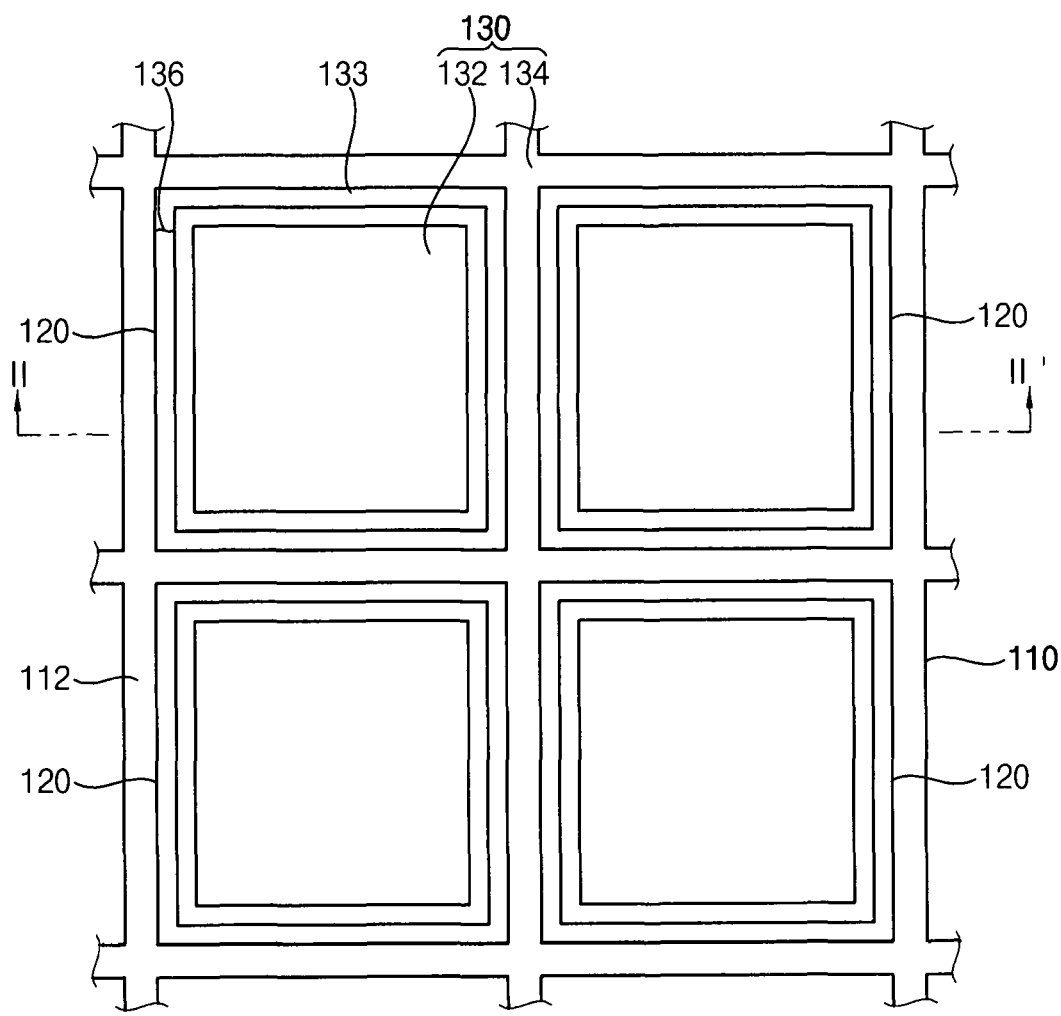
FIGS. 1 to 15 represent non-limiting, example embodiments as described herein.
Figure 2:
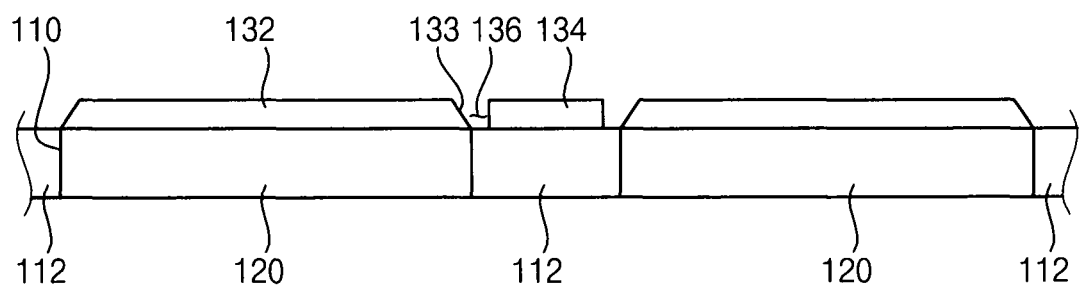

FIG. 1 is a plan view illustrating a semiconductor device in accordance with example embodiments, and FIG. 2 is a partial cross-sectional view taken along a line II-IF in FIG. 1. For example, features to the far left of the left-most semiconductor chip 120 and to the far right of the right-most semiconductor chip 120, which are reflected in FIG. 1, are not shown in FIG. 2.

Referring to FIGS. 1 and 2, a semiconductor device of this example embodiment may include a semiconductor substrate 110, a plurality of semiconductor chips 120 and a passivation structure 130.

Unless context indicates otherwise, it should be appreciated that reference to "undiced chips" refers to a semiconductor device that that has yet to be separated (e.g., from a wafer) to form an individual semiconductor chip, and reference to "diced chips" refers to a semiconductor device that that has been separated (e.g., from a wafer) to form an individual semiconductor chip. As used herein, reference to a "chip" or "semiconductor chip" by itself (i.e., without a "diced" or other similar modifier) will be understood to refer to a semiconductor device embodied in a portion of a wafer that has not yet been cut from the wafer to form an individual semiconductor chip.

The semiconductor chips 120 may be formed on an upper surface of the semiconductor substrate 110. The semiconductor chips 120 may be partitioned by scribe lanes 112 of the semiconductor substrate 110. The scribe lanes 112 may include a first subset of scribe lanes 112 that extend lengthwise in a first direction, and a second subset of scribe lanes 112 that extend lengthwise in a second direction perpendicular to the first direction. The first and second subsets of the scribe lanes 112 may intersect one another, thereby forming a grid pattern. Thus, the scribe lanes 112 may be configured to surround each of the semiconductor chips 120.

In example embodiments, each of the semiconductor chips 120 may have a rectangular cross-sectional shape. Thus, each of the semiconductor chips 120 may have four side surfaces. The semiconductor chips 120 may be arranged spaced apart from each other by a uniform gap in lengthwise and breadthwise directions. Thus, the scribe lanes 112 for partitioning the semiconductor chips 120 may have a cross shape. For example, the scribe lanes 112 may have a rectangular frame shape configured to surround each of the semiconductor chips 120. In some embodiments, the scribe lane 112 between adjacent semiconductor chips 120 may have a uniform width. For example, the scribe lane 112 may correspond to the uniform gap between adjacent semiconductor chips 120.

The passivation structure 130 may include a plurality of first passivation patterns 132 and a second passivation pattern 134. The passivation structure 130 may include a photosensitive polyimide (PSPI).

Each of the first passivation patterns 132 may be arranged on upper surfaces of the semiconductor chips 120. The first passivation pattern 132 may have a size substantially the same as that of the upper surface of the semiconductor chip 120. In example embodiments, because the semiconductor chip 120 may have the rectangular shape, when viewed in plan view, each of the first passivation patterns 132 may also have a rectangular shape, when viewed in plan view. When viewed in cross-section, each of the semiconductor chips 120 may have a rectangular shape and each of the first passivation patterns 132 may have a trapezoidal shape, where the width of the bottom surface of the first passivation pattern 132 corresponds to the width of the semiconductor chip 120 on which the first passivation pattern 132 may be provided. The shape of the first passivation pattern 132 may be changed in accordance with the shape of the semiconductor chip 120.

The second passivation pattern 134 may be formed on an upper surface of the scribe lanes 112. The second passivation pattern 134 may have an upper surface substantially coplanar with an upper surface of the first passivation pattern 132. For example, the first and second passivation patterns 132 and 134 may have the same thickness. Alternatively, the upper surface of the second passivation pattern 134 may be positioned on a plane different from that on which the upper surface of the first passivation pattern 132 may be positioned.

The second passivation pattern 134 may be spaced apart from the first passivation pattern 132. For example, the second passivation pattern 134 may have an outer side surface spaced apart from an inner side surface of the first passivation pattern 132. Thus, a crack-blocking groove 136 may be formed between the first passivation pattern 132 and the second passivation pattern 134. The crack-blocking groove 136 may function so as to separate the first passivation pattern 132 and the second passivation pattern 134 from each other. Further, the second passivation pattern 134 may have a width less than that of the scribe lane 112 by the crack-blocking groove 136.

In example embodiments, because the scribe lanes 112 may have the rectangular frame shape configured to surround the semiconductor chip 120, the second passivation pattern 134 may also have a rectangular frame shape. For example, the second passivation pattern 134 may be comprised of linear segments that together surround each of the semiconductor chips 120. In some embodiments, when the second passivation pattern 134 has a rectangular frame shape, the portion of the second passivation pattern 134 that surrounds a given semiconductor chip 120 may be comprised of four linear segments that are connected together and surround four side surfaces of the rectangular semiconductor chip 120. Thus, the crack-blocking groove 136 between the first passivation pattern 132 and the second passivation pattern 134 may also have a rectangular frame shape. For example, the crack-blocking groove 136 may surround each of the semiconductor chips 120, and may be provided between the first passivation patterns 132 and the segments of the second passivation pattern 134 that surround the semiconductor chips 120.

In example embodiments, the crack-blocking groove 136 may have an upper width and a lower width different from the upper width. The upper width of the crack-blocking groove 136 may be wider or narrower than the lower width of the crack-blocking groove 136. For example, with respect to a top surface of the semiconductor substrate 110, the inner side surface 133 of the first passivation pattern 132 may have a gradually slant shape in an upward direction toward a central portion of the semiconductor chip 120. In contrast, the outer side surface of the second passivation pattern 134 may have a vertical shape (e.g., the outer side surface may be perpendicular to the top surface of the semiconductor substrate 110). In this case, the upper width of the crack-blocking groove 136 may be gradually increased from the lower width. As an alternative example, with respect to the top surface of the semiconductor substrate 110, the inner side surface 133 of the first passivation pattern 132 may have a gradually slant shape in an upward direction toward an edge portion of the semiconductor chip 120. In contrast, the outer side surface of the second passivation pattern 134 may have a vertical shape (e.g., the outer side surface may be perpendicular to the top surface of the semiconductor substrate 110). In this case, the upper width of the crack-blocking groove 136 may be gradually decreased to the lower width.

Further, the outer side surface of the second passivation pattern 134 may have other shapes as well as the vertical shape. For example, the outer side surface of the second passivation pattern 134 may have a slant shape with respect to the top surface of the semiconductor substrate 110, and that slant shape may slant either outward or inward. For example, the inner side surface of the first passivation pattern 132 and the outer side surface of the second passivation pattern 134 for defining the crack-blocking groove 136 may not be restricted within specific shapes.

When the scribe lanes 112 and the second passivation pattern 134 may be cut using a blade, a crack may be generated in the second passivation pattern 134. The crack in the second passivation pattern 134 may not extend through the crack-blocking groove 136. Thus, the crack may not spread into the first passivation pattern 132. As a result, the crack may not spread into the semiconductor chip 120 under the first passivation pattern 132.

When the scribe lanes 112 and the second passivation pattern 134 may be cut using a laser under a condition that a die attach film may be attached to the upper surfaces of the first and second passivation patterns 132 and 134, the second passivation pattern 134 attached to the die attach film may remain on the scribe lanes 112. Thus, during a process when the lower surface of the semiconductor substrate 110 may be grinded to partially remove the lower surface of the semiconductor substrate 110, the remaining second passivation pattern 134 on the scribe lane 134 may prevent the semiconductor chip 120, particularly corners of the semiconductor chip 120, from colliding with each other.

As a result, the semiconductor substrate 110 is sawed by any one of the cutting processes using the blade and the laser to prevent damages of the semiconductor chips 120. For example, the cutting process may be performed by sawing, laser cutting, or other methods.

Figure 3:
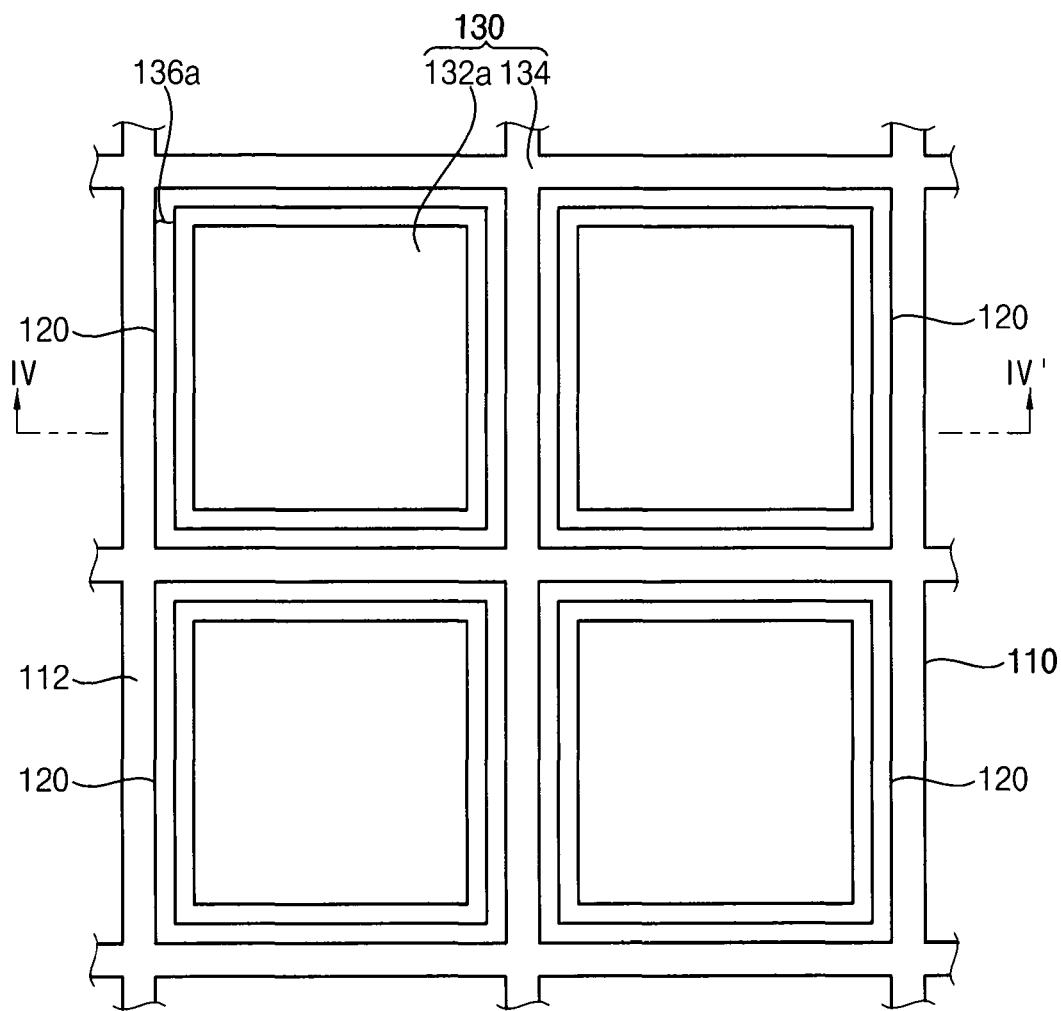
Figure 4:
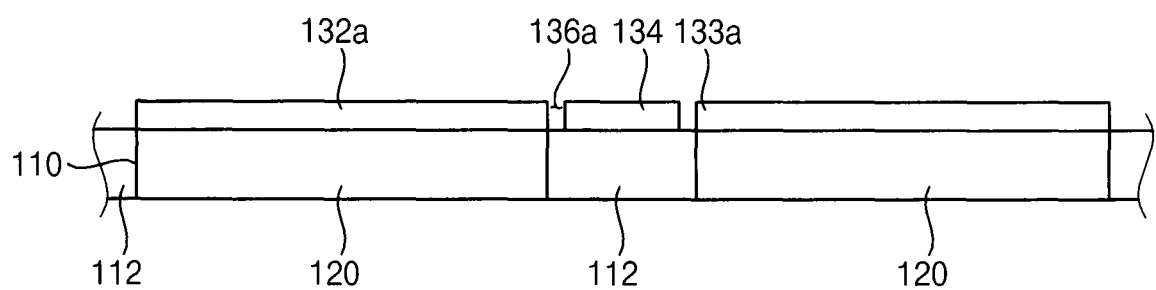

FIG. 3 is a plan view illustrating a semiconductor device in accordance with example embodiments, and FIG. 4 is a partial cross-sectional view taken along a line Iv-Iv' in FIG. 3. For example, features to the far left of the left-most semiconductor chip 120 and to the far right of the right-most semiconductor chip 120, which are reflected in FIG. 3, are not shown in FIG. 4.

A semiconductor device of this example embodiment may include elements that are the same as those of the semiconductor device in FIGS. 1 and 2 except for a first passivation pattern and a crack-blocking groove. Thus, the same reference numerals may refer to the same elements and any further illustrations and/or discussion with respect to the same elements may be omitted herein for brevity.

Referring to FIGS. 3 and 4, a first passivation pattern 132a may have an inner side surface 133a substantially parallel to the outer side surface of the second passivation pattern 134. In this case, a crack-blocking groove 136a may have a same width in a vertical direction. For example, the width of the crack-blocking groove 136a may be substantially uniform from a bottom region to a top region of the crack-blocking groove 136a. However, as mentioned above, the inner side surface 133a of the first passivation pattern 132a and the outer side surface of the second passivation pattern 134 for defining the crack-blocking groove 136a may not be restricted to specific shapes.

Figure 5:
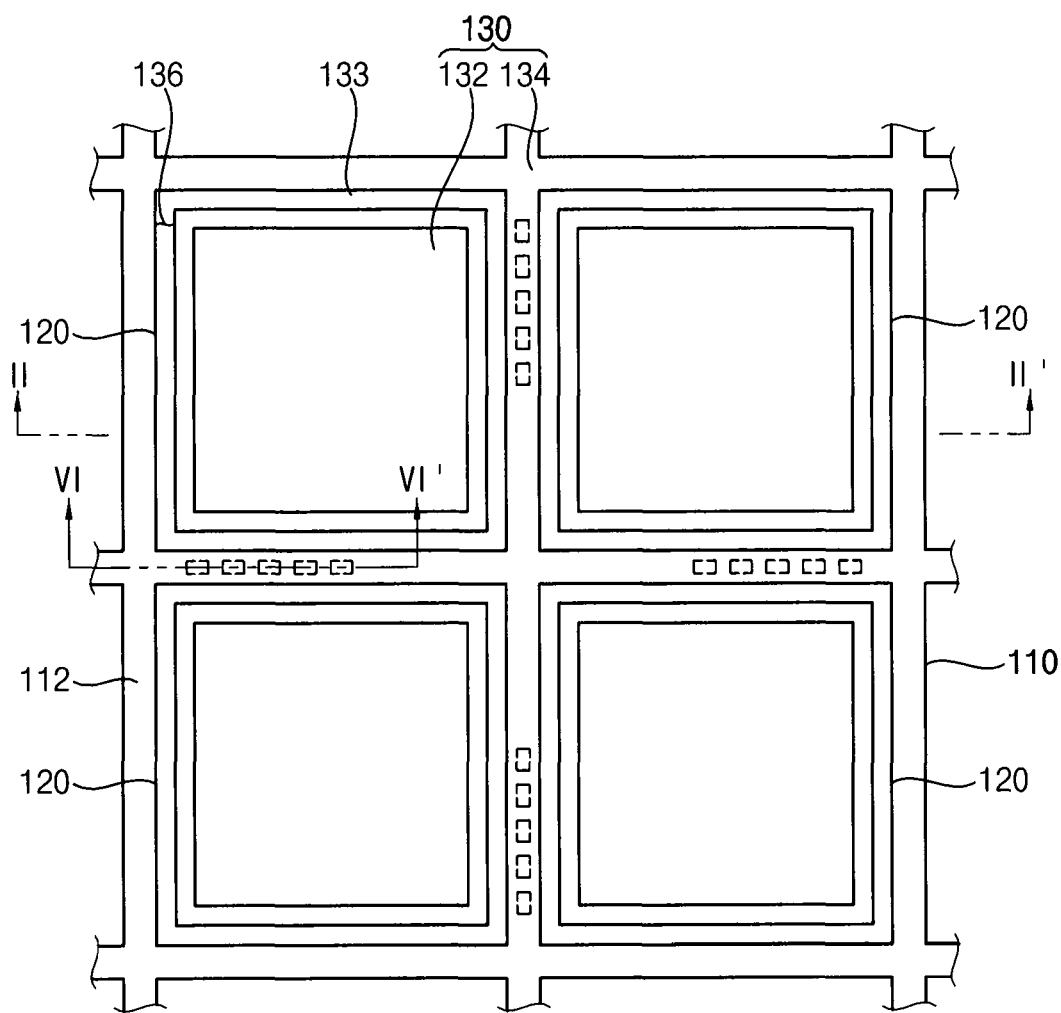
Figure 6:
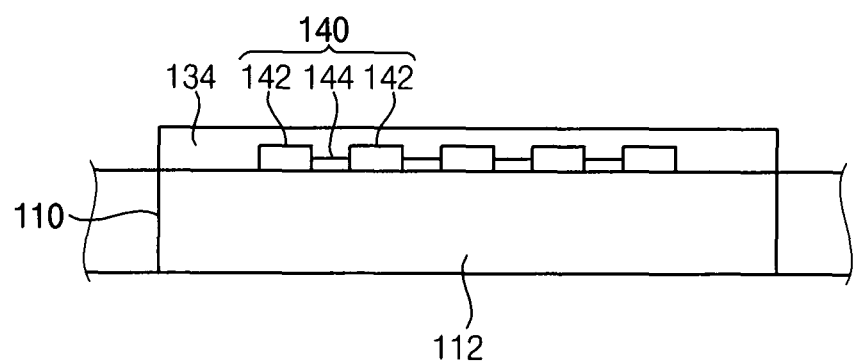

FIG. 5 is a plan view illustrating a semiconductor device in accordance with example embodiments, and FIG. 6 is a partial cross-sectional view taken along a line VI-VI' in FIG. 5.

A semiconductor device of this example embodiment may include elements that are the same as those of the semiconductor device in FIGS. 1 and 2 except for further including a test element group. Thus, the same reference numerals may refer to the same elements and any further illustrations and/or discussion with respect to the same elements may be omitted herein for brevity.

Referring to FIGS. 5 and 6, a test element group (TEG) 140 may be arranged on the upper surface of the scribe lane 112. The TEG 140 may be used for testing electrical characteristics of the semiconductor chips 120. Thus, the TEG 140 may be electrically connected with the semiconductor chips 120.

The TEG 140 may include a plurality of test pads 142 and a plurality of test lines 144. The test pads 142 may be connected to one another through the test lines 144. The test pads 142 may include aluminum. The test lines 144 may include copper.

The second passivation pattern 134 may cover the TEG 140. Thus, the test pads 142 and the test lines 144 may not be exposed so that the test pads 142 and the test lines 144 may not make contact with air. Therefore, corrosions of the test pads 142 and the test lines 144 may be suppressed. Particularly, because the test lines 144 may be covered by the second passivation pattern 134, the corrosion of the test lines 144 including the copper may be suppressed.

Method of Cutting a Semiconductor Substrate

Figure 7:
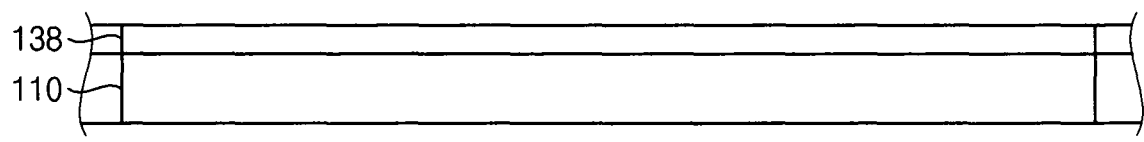
Figure 8:
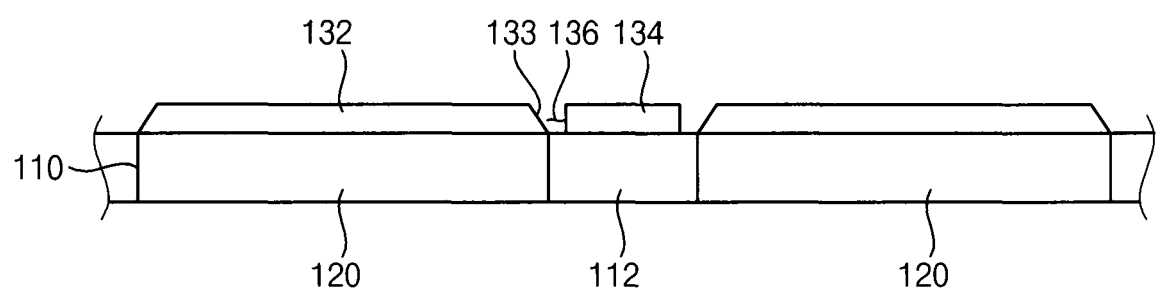
Figure 9:
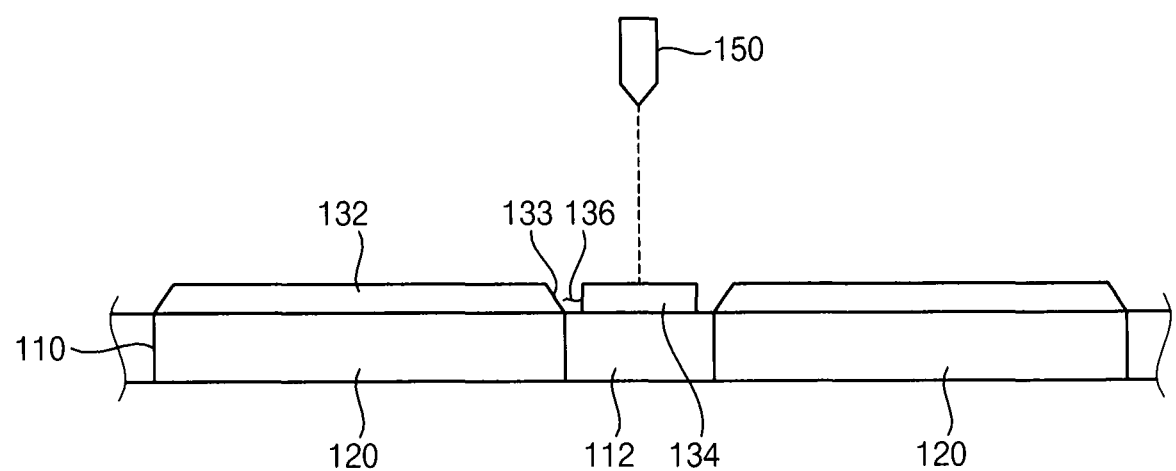

FIGS. 7 to 9 are partial cross-sectional views illustrating a method of cutting a semiconductor substrate using a blade in accordance with example embodiments. In FIGS. 7 to 9, features to the far left of the left-most semiconductor chip 120 and to the far right of the right-most semiconductor chip 120 may not be shown. The partial cross-sections of FIGS. 7 to 9 may correspond to a view taken along line I-I' of FIG. 1.

Referring to FIG. 7, a passivation layer 138 may be formed on the upper surface of the semiconductor substrate 110. Particularly, the passivation layer 138 may be formed on the upper surfaces of the semiconductor chips 120 and the upper surface of the scribe lanes 112. In some embodiments, the scribe lanes 112 may comprise areas of the semiconductor substrate 110 in which no circuits (e.g., no transistors) may be formed and/or no circuits (e.g., no transistors) may be formed that are part of the integrated circuits of the undiced semiconductor chips 120 and may not exchange signals with the integrated circuits of the undiced semiconductorchips 120.

Referring to FIG. 8, the passivation layer 138 may be patterned to form the first passivation patterns 132 and the second passivation pattern 134. Particularly, the passivation layer 138 may be etched until the upper surface of the scribe lanes 112 may be exposed to form the first passivation patterns 132 and the second passivation pattern 134. The crack-blocking groove 136 may be formed between each of the first passivation patterns 132 and the second passivation pattern 134 by the etching process.

Each of the first passivation patterns 132 may be arranged on the upper surface of the semiconductor chip 120. The second passivation pattern 134 may be arranged on the upper surface of the scribe lanes 112. The shapes and the functions of the first and second passivation patterns 132 and 134 and the crack-blocking groove 136 may be illustrated with reference to FIGS. 1 and 2. Thus, any further illustrations with respect to the shapes and the functions of the first and second passivation patterns 132 and 134 and the crack-blocking groove 136 may be omitted herein for brevity.

Alternatively, the first passivation patterns 132a and the crack-blocking groove 136a in FIGS. 3 and 4 may be formed on the upper surface of the semiconductor chip 120. Further, the TEG 140 in FIGS. 5 and 6 may be formed on the upper surface of the scribe lane 112. The TEG 140 may be covered with the second passivation pattern 134.

Referring to FIG. 9, a blade 150 may be positioned over the second passivation pattern 134. In some embodiments, the blade 150 may be centered over a midline of the second passivation pattern 134. The blade 150 may cut the second passivation pattern 134 and the scribe lane 112.

During cutting the passivation pattern 134 and the scribe lane 112 using the blade 150, a crack may be generated in the second passivation pattern 134 and/or the scribe lane 112. The crack-blocking groove 136 may block the spreading of the crack. Thus, the crack may not spread into the first passivation pattern 132. As a result, the crack may also not spread into the semiconductor chip 120 under the first passivation pattern 132.

Likewise, referring to the embodiment of FIGS. 3 and 4, blocking groove 136a may block the spreading of the crack, and the crack may not spread into the first passivation pattern 132a. As a result, the crack may also not spread into the semiconductor chip 120 under the first passivation pattern 132a.

FIGS. 10 to 15 are cross-sectional views illustrating a method of cutting a semiconductor substrate using a laser in accordance with example embodiments.

Figure 10:
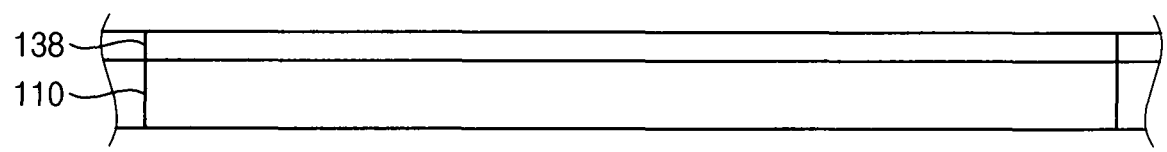

Referring to FIG. 10, a passivation layer 138 may be formed on the upper surface of the semiconductor substrate 110. Particularly, the passivation layer 138 may be formed on the upper surfaces of the semiconductor chips 120 and the upper surface of the scribe lanes 112.

Figure 11:
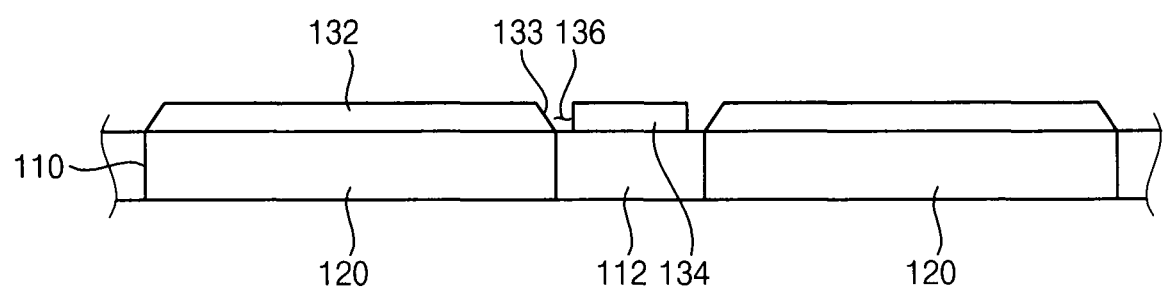

Referring to FIG. 11, the passivation layer 138 may be patterned to form the first passivation patterns 132 and the second passivation pattern 134. Particularly, the passivation layer 138 may be etched until the upper surface of the scribe lanes 112 may be exposed to form the first passivation patterns 132 and the second passivation pattern 134. The crack-blocking groove 136 may be formed between each of the first passivation patterns 132 and the second passivation pattern 134 by the etching process.

Each of the first passivation patterns 132 may be arranged on the upper surface of the semiconductor chip 120. The second passivation pattern 134 may be arranged on the upper surface of the scribe lanes 112. The shapes and the functions of the first and second passivation patterns 132 and 134 and the crack-blocking groove 136 may be illustrated with reference to FIGS. 1 and 2. Thus, any further illustrations with respect to the shapes and the functions of the first and second passivation patterns 132 and 134 and the crack-blocking groove 136 may be omitted herein for brevity.

Alternatively, the first passivation patterns 132a and the crack-blocking groove 136a in FIGS. 3 and 4 may be formed on the upper surface of the semiconductor chip 120. Further, the TEG 140 in FIGS. 5 and 6 may be formed on the upper surface of the scribe lane 112. The TEG 140 may be covered with the second passivation pattern 134.

Figure 12:
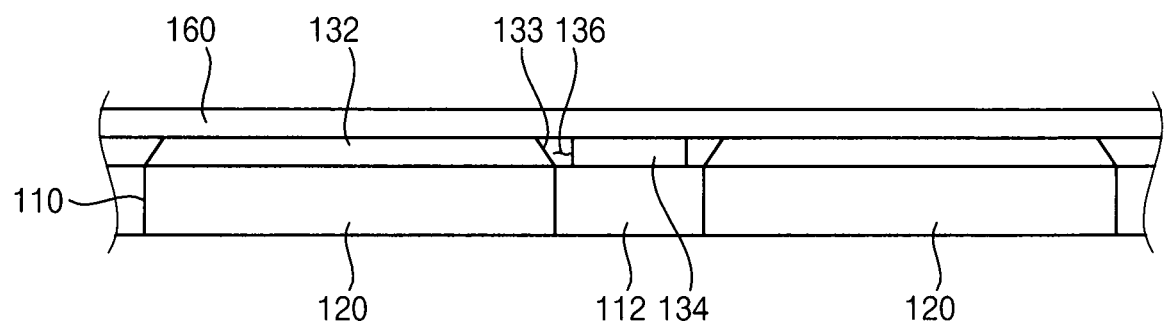

Referring to FIG. 12, a die attach film 160 may be attached to the upper surfaces of the first passivation pattern 132 and the second passivation pattern 134. The die attach film 160 may include a flexible film.

Figure 13:
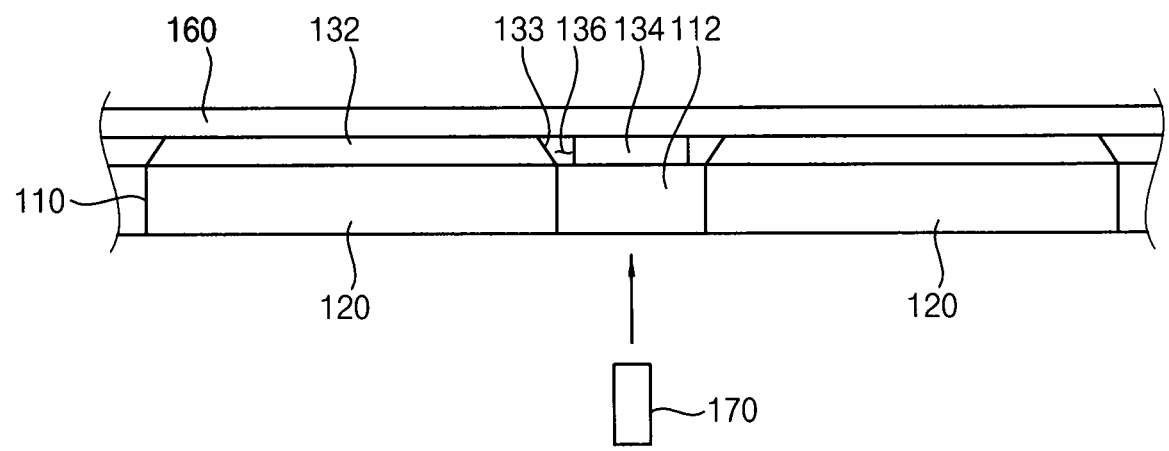

Referring to FIG. 13, a laser irradiator 170 positioned under the semiconductor substrate 110 may irradiate a laser to the scribe lane 112. The laser may be incident to the scribe lane 112 and the second passivation pattern 134. In contrast, the laser may not be incident to the die attach film 160.

Figure 14:
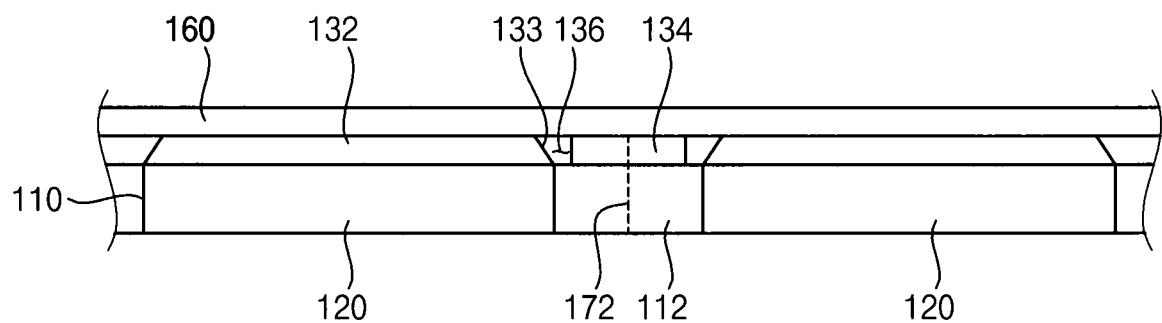

Referring to FIG. 14, a cut line 172 may be formed in the scribe lane 112 and the second passivation pattern 134 by the irradiation of the laser. In contrast, because the laser may not be incident to the die attach film 160, a cut line may not be formed in the die attach film 160. The scribe lane 112 and the second passivation pattern 134 may be divided along the cut line 172. Thus, the semiconductor chips 120 may also be divided along the cut line 172.

However, because the semiconductor chips 120 may be connected with each other via the first passivation pattern 132, the semiconductor chips 120 may not be completely separated. Because the die attach film 160 may include the flexible material, the semiconductor chips 120 may be slightly moved. The semiconductor chips 120 may be moved in every direction. Thus, the corners of the semiconductor chips 120 may enter into the scribe lane 112 so that the corners of the semiconductor chips 120 may be positioned adjacent to each other. The corners of the semiconductor chips 120 may collide with each other to generate damages of the semiconductor chips 120.

However, because the separated second passivation patterns 134 may be attached to the die attach film 160, the separated second passivation patterns 134 may remain in the scribe lanes 112. Thus, the separated second passivation patterns 134 may prevent contacts between the semiconductor chips 120 in the scribe lanes 112. As a result, the corners of the semiconductor chips 120 may not collide with each other, thereby preventing damages to the semiconductor chips 120.

Figure 15:
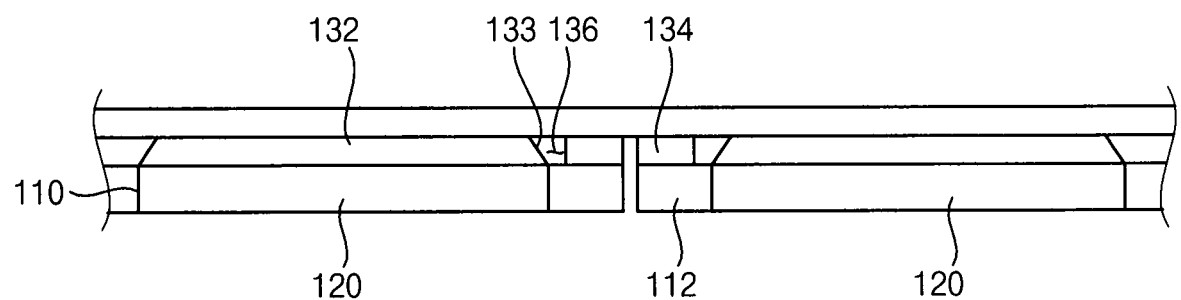

Referring to FIG. 15, the lower surface of the semiconductor substrate 110 may be partially removed to reduce a thickness of each of the semiconductor chips 120. The lower surface of the semiconductor substrate 110 may be removed by the grinding process.

During the grinding process, the collisions of the semiconductor chips may be further generated. However, as mentioned above, the separated second passivation patterns 134 may suppress the contacts between the semiconductor chips 120 in the scribe lanes 112 to prevent the damages of the semiconductor chips 120.

According to example embodiments, the first passivation pattern on the semiconductor chips may be separated from the second passivation pattern on the scribe lane. When the semiconductor substrate may be sawed using a blade, a crack generated in the second passivation pattern by the blade may not spread into the first passivation pattern. Thus, the crack may not spread into the semiconductor chip under the first passivation pattern. Further, when the semiconductor substrate may be sawed using a laser, the second passivation pattern may remain on the scribe lane. Thus, the remaining second passivation pattern on the scribe lane may prevent the semiconductor chips from colliding with each other in a grinding process. As a result, the cutting processes using the blade and the laser may be applied to the semiconductor substrate without damages of the semiconductor chips.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A passivation structure comprising:
   a first passivation pattern on an upper surface of a semiconductor chip provided on a semiconductor substrate; and
   a second passivation pattern arranged on a scribe lane of the semiconductor substrate adjacent to the semiconductor chip,
   wherein the second passivation pattern is spaced apart from the first passivation pattern to form a crack-blocking groove between the second passivation pattern and the first passivation pattern,
   wherein the crack-blocking groove is formed by a side surface of the first passivation pattern and a side surface of the second passivation pattern, and
   wherein the crack-blocking groove is formed on the scribe lane and exposes a top surface of the scribe lane.

2. The passivation structure of claim 1, wherein the scribe lane is extended along the second passivation pattern.

3. The passivation structure of claim 1, wherein the semiconductor chip has four sides, and the scribe lane is extended along the four sides.

4. The passivation structure of claim 1, wherein a width of the scribe lane is greater than a width of the second passivation pattern.

5. The passivation structure of claim 1, wherein the first and the second passivation patterns comprise photosensitive polyimide (PSPI).

6. The passivation structure of claim 1, wherein the crack-blocking groove has a lower width and an upper width greater than the lower width.

7. The passivation structure of claim 1, wherein the crack-blocking groove has a substantially uniform width.

8. A passivation structure comprising:
   a plurality of first passivation patterns, each of the first passivation patterns arranged on an upper surface of a respective one of a plurality of semiconductor chips provided on a semiconductor substrate; and
   a second passivation pattern arranged on scribe lanes of the semiconductor substrate for partitioning the semiconductor chips,
   wherein the second passivation pattern is spaced apart from each first passivation pattern to form a crack-blocking groove between the second passivation pattern and each of the first passivation patterns,
   wherein the crack-blocking groove is formed by a side surface of the second passivation pattern and side surfaces of the first passivation patterns, and
   wherein the crack-blocking groove exposes top surfaces of the scribe lanes.

9. The passivation structure of claim 8, wherein on each scribe lane, the second passivation pattern has a width less than that of the scribe lane.

10. The passivation structure of claim 8, wherein the scribe lanes are configured to surround each of the plurality of semiconductor chips, and the second passivation pattern is extended along the scribe lanes.

11. The passivation structure of claim 10, wherein each of the semiconductor chips has a rectangular shape, and the second passivation pattern is extended along the scribe lanes and configured to surround four side surfaces of each rectangular semiconductor chip.

12. The passivation structure of claim 8, wherein the crack-blocking groove has a lower width and an upper width greater than the lower width.

13. The passivation structure of claim 12, wherein the upper width is gradually increased from the lower width.

14. The passivation structure of claim 8, wherein the crack-blocking groove has a uniform width.

15. A method of manufacturing a semiconductor device, comprising:
   providing a semiconductor substrate having scribe lanes;
   forming a plurality of semiconductor chips on an upper surface of the semiconductor substrate;
   forming a plurality of first passivation patterns, each of the first passivation patterns arranged on an upper surface of a respective one of the plurality of semiconductor chips; and
   forming a second passivation pattern arranged on an upper surface of the scribe lanes,
   wherein the second passivation pattern is spaced apart from each first passivation pattern to form a crack-blocking groove between the second passivation pattern and the first passivation patterns,
   wherein the crack-blocking groove is formed by a side surface of the second passivation pattern and side surfaces of the first passivation patterns, and
   wherein the crack-blocking groove exposes top surfaces of the scribe lanes.

16. The method of claim 15, further comprising providing at least one test element group (TEG), which is arranged on an upper surface of at least one of the scribe lanes and covered by the second passivation pattern.

17. The method of claim 16, wherein the TEG comprises:
   at least two pads arranged on the upper surface of at least one of the scribe lanes; and
   a test line connected between the at least two pads.

18. The method of claim 15, wherein for each scribe lane, the second passivation pattern has a width less than that of the scribe lane on which it is arranged.

19. The method of claim 15, wherein the crack-blocking groove has a lower width and an upper width greater than the lower width.

20. The method of claim 19, wherein the upper width is gradually increased from the lower width.

\* \* \* \* \*